United States Patent
Benesty et al.

(12)

(10) Patent No.: US 6,526,141 B2
(45) Date of Patent: Feb. 25, 2003

(54) METHOD AND APPARATUS FOR NETWORK ECHO CANCELLATION USING A PROPORTIONATE NORMALIZED LEAST MEAN SQUARES ALGORITHM

(75) Inventors: Jacob Benesty, Summit, NJ (US); Steven Leslie Gay, Long Valley, NJ (US)

(73) Assignee: Agere Systems, Inc., Berkeley Heights, NJ (US)

( * ) Notice: Subject to any disclaimer, the term of this patent is extended or adjusted under 35 U.S.C. 154(b) by 0 days.

(21) Appl. No.: 09/730,442

(22) Filed: Dec. 5, 2000

(65) Prior Publication Data

US 2002/0114445 A1 Aug. 22, 2002

(51) Int. Cl.⁷ .................................. H04M 1/00
(52) U.S. Cl. ................ 379/406.09; 379/406.01
(58) Field of Search ............ 379/406.01, 406.09

(56) References Cited

U.S. PATENT DOCUMENTS 5,951,626 A 9/1999 Duttweiler .......... 708/322

OTHER PUBLICATIONS

Gay, S.L. "An efficient, fast converging adaptive filter for network echo cancellation", Proc. of Assilomar, 1998.*
Gay, S.L., "An efficient, fast converging adaptive filter for network echo cancellation", *Proc. Of Assilomar*, 1998.

* cited by examiner

*Primary Examiner*—Forester W. Isen
*Assistant Examiner*—Jefferey F Harold
(74) *Attorney, Agent, or Firm*—Synnestvedt & Lechner LLP

(57) ABSTRACT

The invention is a method and apparatus for performing adaptive filtering, and particularly echo cancellation, utilizing an efficient and effective adaptive algorithm. The invention is particularly useful in connection with network echo cancellation but is more broadly applicable to any situation where an adaptive estimate of a signal must be generated in real-time.

The invention includes an improved proportionate normalized least mean squares algorithm for generating an impulse response estimate that is useful for generating an echo cancellation signal to be subtracted from the echo containing signal.

23 Claims, 10 Drawing Sheets

METHOD AND APPARATUS FOR NETWORK ECHO CANCELLATION USING A PROPORTIONATE NORMALIZED LEAST MEAN SQUARES ALGORITHM

FIELD OF THE INVENTION

The invention pertains to network echo cancellation. The invention is particularly suitable for use for hybrid echo cancellation at a two wire to four wire interface in a communications network such as a telephone network.

BACKGROUND OF THE INVENTION

In communications networks, it is possible for an echo of an upstream signal to be coupled onto a downstream signal (directions arbitrary), which echo either corrupts data or decreases the quality of data (e.g., increased noise). For instance, in telephone communications networks, the individual customers usually couple into the main telephone network through a two wire, analog connection in which transmissions in both directions are carried on the same pair of wires (tip and ring). However, the central portion of the network typically is a four wire, digital system in which communications in the upstream and downstream directions are carried on separate wire pairs (i.e., two wires in the receive direction and two wires in the transmit direction).

The interface between the two wire and the four wire portions of the network are a source of echo. The echos typically result because the impedance of the 2-wire facility is imperfectly balanced in the 4-to-2 wire junction causing the incoming signal to be partially reflected over an outgoing path to the source of incoming signals.

The circuitry interfacing the two wire and four wire portions of the network is commonly termed a line interface card. The standard components of a line interface card are well known to persons of skill in the related arts. One of those components is a hybrid cancellation circuit, the function of which is to cancel echo signals in order to improve the quality of service. In short, a hybrid cancellation circuit generates an attenuated version of the original receive signal (that is the source of the echo) and subtracts it from the signal lines that carry the transmit signal onto which the echo has been imposed. These hybrid cancellation circuits utilize an adaptive filter to operate on a supplied signal in a prescribed manner such that a desired output signal is generated.

Typically, adaptive filters generate a transfer function according to an algorithm that includes updating the transfer function characteristic in response to an error signal. In this manner, the filter characteristic is optimized to produce a desired result.

When used in an echo cancellation circuit, an adaptive filter is used to generate an echo path estimate that is updated in response to an error signal. Adaptive echo cancelers have been employed to mitigate the echoes by adjusting the transfer function (impulse response) characteristic of an adaptive filter to generate an estimate of the reflected signal or echo and, then, subtracting it from the outgoing signal. The filter impulse response characteristic and, hence, the echo estimate is updated in response to the outgoing signal for more closely approximating the echo to be canceled.

Various designs and algorithms for adaptive filters for echo cancellation are well known. Although prior art arrangements of adaptive filters perform satisfactorily in some applications, often it is impossible to simultaneously achieve both sufficiently fast response to changing echo paths and sufficiently high steady-state estimation quality. Consequently a continuing need is to achieve more rapid response to changing conditions while at the same time maintaining adequate steady-state estimation quality.

FIG. 1 is a block diagram illustrating an exemplary network echo cancellation circuit 10. Input line 12 carries the far-end signal x(n) (i.e., the receive direction signal relative to the transceiver having the echo cancellation circuit) Input line 14 carries the near-end signal v(n) as well as background noise w(n). The far-end signal x(n) is the source of potential echo.

Block 16 represents the true echo path h which is coupled into the near-end signal on line 14 as represented by summation node 18. In accordance with an echo cancellation scheme, the far-end signal x(n) is also input into an echo cancellation circuit 20 which generates an estimated echo path h(n). The estimated signal path h(n) is generated using a digital adaptive filter algorithm as illustrated by block 124. The estimated echo signal is then subtracted at subtraction circuit 26 from the signal path y(n), which includes the true echo h, the near-end signal v(n), and the background noise w(n).

Other circumstances in which network echo cancellation may be necessary or at least desirable are numerous and would be well known to persons of skill in the related arts.

Even further, acoustic echo cancellation systems are known in the prior art such as in connection with audio teleconferencing equipment. Particularly, when using a speaker phone, there is a path between the telephone speaker and the telephone microphone through which an echo can be introduced. Particularly, the microphone in a room picks up the sound created in the room. Part of the sound created in the room includes the sound coming from the opposite end of the telephone call that emanates from the telephone speaker. This creates a feedback loop that can result in distortion and, in the worst cases, howling instability.

Many digital adaptive algorithms for echo cancellation are known in the prior art, including Least Mean Squares (LMS) algorithms, Normalized Least Mean Squares (NLMS) algorithms, and Proportionate Normalized Least Mean Squares (PNLMS) among others.

U.S. Pat. No. 5,951,626 issued to Duttweiler and assigned to the same assignee as the present application discloses a PNLMS algorithm that has a very fast initial convergence and tracking of the true echo path when the echo path is sparse, i.e., relatively few of the coefficients are non-zero, compared to other methods such as NLMS. However, when the echo path is dispersive, PNLMS converges much more slowly than NLMS. Simulations support the conclusion that the full benefits of PNLMS in terms of fast convergence and tracking of the true echo path are achieved only when the impulse response is close to a delta function.

Accordingly, it is an object of the present invention to provide an improved adaptive filter.

It is another object of the present invention to provide and improved echo cancellation method and apparatus.

It is a further object of the present invention to provide an algorithm particularly adapted for echo cancellation that has fast convergence and echo path tracking over a broad range of echo paths.

SUMMARY OF THE INVENTION

The invention is a method and apparatus for performing adaptive filtering, and particularly echo cancellation, utilizing an efficient and effective adaptive algorithm. The invention is particularly useful in connection with network echo cancellation but is more broadly applicable to any situation where an adaptive estimate of a signal must be generated in real-time.

The invention includes an improved proportionate normalized least mean squares algorithm for generating an impulse response estimate that is useful for generating an echo cancellation signal to be subtracted from the echo containing signal.

DETAILED DESCRIPTION OF THE INVENTION

I. Introduction

Recently, the proportionate normalized least mean square (PNLMS) algorithm was developed for use in network echo cancelers. D. L. Duttweiler, "Proportionate normalized least mean square adaptation in echo cancelers," *IEEE Trans. Speech Audio Processing,* vol. 8, pp. 508–518, September 2000. In comparison to the normalized least mean square (NLMS) algorithm, PNLMS has a very fast initial convergence and tracking when the echo path is sparse. The idea behind PNLMS is to update each coefficient of the filter independently of the others by adjusting the adaptation step size in proportion to the estimated filter coefficient. Unfortunately, when the impulse response is dispersive, the PNLMS converges much more slowly than NLMS. This implies that the rule proposed in PNLMS is far from optimal. In many simulations, it seems that one fully benefits from PNLMS only when the impulse response is close to a delta function.

More recently, the so-called PNLMS++ was proposed in S. L. Gay, "An efficient, fast converging adaptive filter for network echo cancellation," in *Proc. Of Assilomar*, 1998. PNLMS++ partially solves the above-mentioned problem by alternating the update process each sample period between NLMS and PNLMS algorithms. However, this solution is far to be general.

An optimal rule should better exploit the shape of the estimated echo path and the algorithm should always have better performance (convergence speed) than NLMS with non-dispersive impulse responses and similar performance with highly dispersive impulse responses. In other words, the echo path should not need to be sparse in order to be able to accelerate the convergence rate of the algorithm.

In this specification, we propose a new rule that is more reliable than the one used in PNLMS. Many simulations show that the obtained algorithm (improved PNLMS) performs better than NLMS and PNLMS, whatever the nature of the impulse response.

II. The NLMS and PNLMS Algorithms

In this section, we briefly explain the NLMS and PNLMS algorithms. In derivations and descriptions, the following notations are used for these quantities:

x(n)=Far-end signal, y(n)=Echo and background noise, x(n)=[x(n) , . . . , x(n−L+1)]$^T$, Excitation vector, h=[h$_0$, . . . , h$_{L-1}$]$^T$, True echo path, ĥ(n)=[ĥ$_0$(n), . . . , ĥ$_{L-1}$(n)]$^T$, Estimated echo path.

Here, L is the length of the adaptive filter, and n is the time index.

Figure 1:
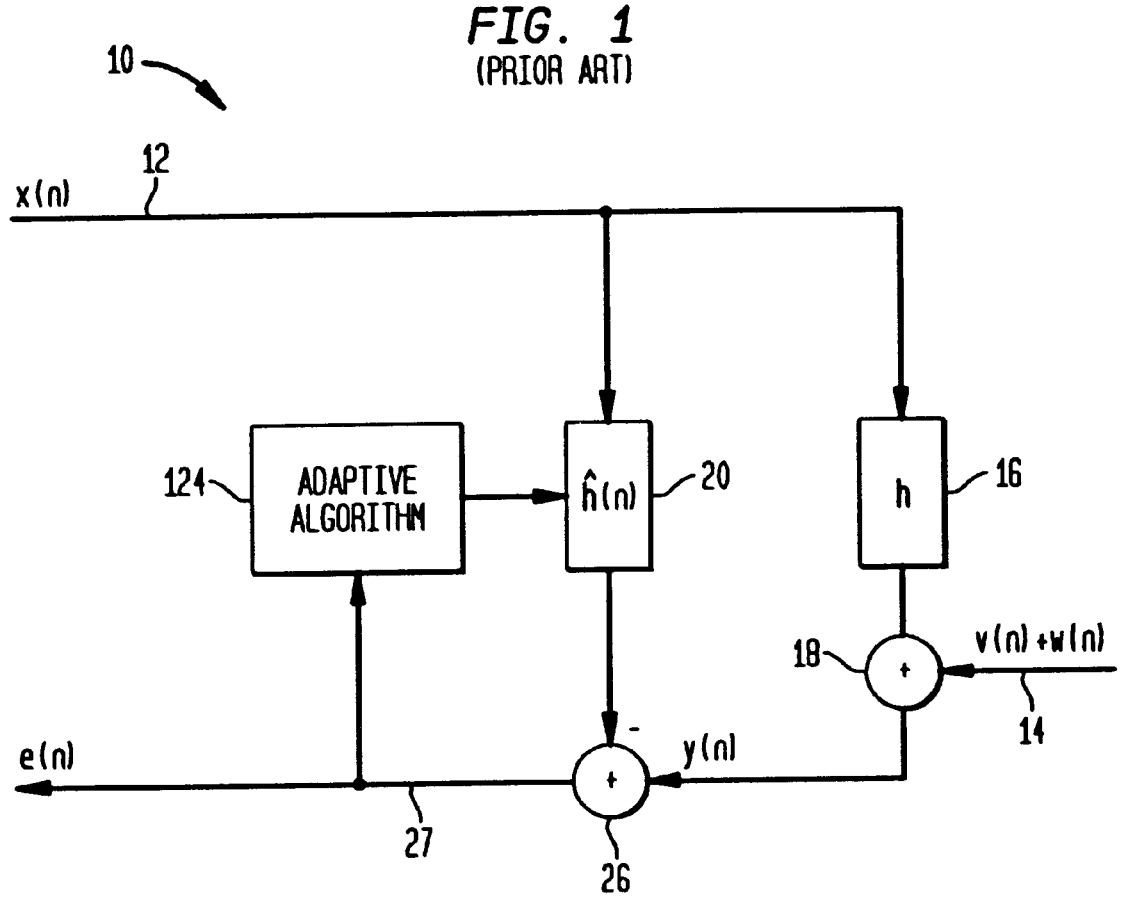
FIG. 1 is a functional block diagram illustrating the operation of a typical echo cancellation circuit of the prior art.

Referring to FIG. 1, the purpose of the adaptive filter is to estimate the echo path so that it can subtract a replica of the returned echo, y(n). Traditionally, the NLMS algorithm has been the work-horse in echo canceler implementation. It therefore serves as a reference algorithm. The coefficient update equation is given by, $$e(n)=y(n)-+e,cir\ h^T+ee\ (n-1)x(n),\qquad(1)$$

$$\hat{h}(n) = \hat{h}(n-1) + \frac{\mu}{x^T(n)x(n) + \delta_{NLMS}} x(n)e(n),\qquad(2)$$

Where $\mu(0<\mu<2)$ is the adaptation step and $\delta_{NLMS}$ is the regularization factor.

In this algorithm, an adaptive individual step-size is assigned to each filter coefficient. The step-sizes are calculated from the last estimate of the filter coefficients in such a way that a larger coefficient receives a larger increment, thus, increasing the convergence rate of that coefficient. The result is that active coefficients are adjusted faster than non-active coefficients (i.e. small or zero coefficients). Hence, PNLMS converges much faster than NLMS for sparse impulse responses (i.e., responses in which only a small percentage of coefficients is significant). Most impulse responses in the telephone network have this characteristic.

The PNLMS algorithm is described by the following equations:

$$e(n)=y(n)-+e,cir\ h^T+ee\ (n-1)x(n)\qquad(3)$$

$$\hat{h}(n) = \hat{h}(n-1) + \frac{\mu}{x^T(n)G(n-1)x(n) + \delta_{PNLMS}} G(n-1)x(n)e(n)\qquad(4)$$

$$G(n-1)=\text{diag}\{g_0(n-1), \ldots, g_{L-1}(n-1)\}\qquad(5)$$

Where G(n−1) is a diagonal matrix which adjusts the step-sizes of the individual taps of the filter, $\mu$ is the overall step-size parameter (the same as NLMS to achieve the same final misadjustment), and $\delta_{PNLMS}$ is a regularization parameter which prevents division by zero and stabilizes the solution when speech is the input signal. The diagonal elements of G(n) are calculated as follows;

$$\gamma_l(n)=\max\{\rho\max\{\delta_p,|\hat{h}_0(n)|, \ldots, |\hat{h}_{L-1}(n)|\}, |\hat{h}_l(n)|\}\qquad(6)$$

$$g_l(n) = \frac{\gamma_l(n)}{\sum_{i=0}^{L-1} \gamma_i(n)},\quad 0 \le l \le L-1\qquad(7)$$

Parameters $\delta_p$ and $\rho$ are positive numbers with typical values $\delta_p=0.01$, $\rho=5/L$. $\rho$ prevents coefficients from stalling when they are much smaller than the largest coefficient and $\delta_p$ regularizes the updating when all coefficients are zero at initialization.

A variant of this algorithm is the PNLMS++, S. L. Gay, "An efficient fast converging adaptive filter for network echo cancellation", Proc. of ASSILOMAR, November 1998. In this algorithm, for odd-numbered time steps, the matrix G(n) is calculated as above, while, for even-numbered steps, it is chosen to be the identity matrix, $$G(n)=I,\qquad(8)$$

which results in an NLMS iteration. Alternating between NLMS and PNLMS iterations has the advantage of making the convergence rate not worse than NLMS. As a result, the PNLMS ++ algorithm is less sensitive to the assumption of a sparse impulse response than PNLMS. However, PNLMS++ is not a completely satisfactory solution because it does not truly exploit the structure of the estimated impulse response. Indeed, switching between the two algorithms will work well only in the two extreme cases when the impulse response is sparse or highly dispersive. But if the impulse response is something between sparse and dispersive, PNLMS++ will likely converge as fast as NLMS since the rule used in PNLMS does not work for this case.

III. An Improved PNLMS (IPNLMS) Algorithm

In this section, we introduce a "true" PNLMS algorithm. Our objective is to derive a rule that better exploits the "proportionate" idea than the original PNLMS. The fact that PNLMS is slower than NLMS with dispersive impulse responses means that (Eq. 6) has to be modified. Intuitively, the brutal choice (maximum) in (Eq. 6) between |ĥ$_l$| and one other positive number can have a disastrous effect on the convergence of the algorithm when the estimation of the coefficients is not accurate. In the following, we propose to change this part and make the choice smoother.

The 1-norm of the adaptive filter is defined as:

$$\|\hat{h}(n)\|_1 = \sum_{l=0}^{L-1} |\hat{h}_l(n)|$$

An alternative to (Eq. 6) is:

$$o_l(n) = (1-\alpha)\frac{\|\hat{h}(n)\|_1}{L} + (1+\alpha)|\hat{h}_l(n)| \quad (9)$$

$$l = 0, 1, \ldots, L-1$$

where, $-1 \leq \alpha < 1$. Taking the 1-norm of vector o:

$$\|o(n)\|_1 = \sum_{l=0}^{L-1} |o_l(n)| \quad (10)$$

$$= \sum_{l=0}^{L-1} o_l(n)$$

$$= 2\|\hat{h}(n)\|_1,$$

we deduce the IPNLMS algorithm:

$$e(n) = y(n) - \hat{h}^T(n-1)x(n) \quad (11)$$

$$\hat{h}(n) = \quad (12)$$

$$\hat{h}(n-1) + \frac{\mu}{x^T(n)O_1(n-1)x(n) + \delta_{IPNLMS}} O_1(n-1)x(n)e(n)$$

$$O_1(n-1) = \text{diag}\{o_{1,0}(n-1), \ldots, o_{1,L-1}(n-1)\}, \quad (13)$$

$$= \frac{1}{\|o(n-1)\|_1} \text{diag}\{o_0(n-1) \ldots, o_{L-1}(n-1)\}$$

where $$o_{1,l}(n) = \frac{o_l(n)}{\|o(n)\|_1} \quad (14)$$

$$= \frac{1-\alpha}{2L} + (1+\alpha)\frac{|\hat{h}_l(n)|}{2\|\hat{h}(n)\|_1}, \quad l = 0, 1, \ldots, L-1$$

In practice, in order to avoid a division by zero in (Eq. 14), especially at the beginning of the adaptation where all the taps of the filter are initialized to zero, we propose to use a slightly modified form:

$$o_{1,l}(n) = \frac{1-\alpha}{2L} + (1+\alpha)\frac{|\hat{h}_l(n)|}{2\|\hat{h}(n)\|_1 + \varepsilon}, \quad (15)$$

$$l = 0, 1, \ldots, L-1$$

where $\varepsilon$ is a very small positive number. At initialization, since all the taps of the filter start with zero, vector x is multiplied by $$\frac{1-\alpha}{2L}.$$

This suggests that the regularization parameter for the IPNLMS algorithm should be taken as:

$$\delta_{IPNLMS} = \frac{1-\alpha}{2L}\delta_{NLMS} \quad (16)$$

For $\alpha = -1$, it can easily be checked that the IPNLMS and NLMS algorithms are identical. For $\alpha$ close to 1, the IPNLMS behaves like the PNLMS. Equation (9) is the sum of two terms. The first one is an average of the absolute value of the coefficients of the estimated filter and the second one is the absolute value of the coefficient itself. While the second term ("proportionate") is very important to improve the convergence rate when the impulse response is sparse, it can also be harmful because it is just an approximation of the coefficient and, if this value is far from the true one, it can have just the opposite effect on the gradient. The first term of (Eq. 9) is more accurate, since it is an average, and balances the errors introduced in the second term. In practice, good choices for $\alpha$ are 0 or $-0.5$. With those choices and in simulations, IPNLMS always behaves better than NLMS and PNLMS, whatever the impulse response.

IV. Simulations

As noted above, in telephone connections that involve connection of 4-wire and 2-wire links, an echo is generated at the hybrid that has a disturbing influence on the conversation and must therefore be canceled. Referring again to FIG. 1, the far-end speech signal x(n) goes through the echo path represented by a filter h, then it is added to the near-end talker signal v(n) and ambient noise w(n). The composite signal is denoted y(n). Most often, the echo path is modeled by an adaptive FIR filter, ĥ(n), which subtracts a replica of the echo and thereby achieves cancellation. Here, we do not consider the double-talk situation (i.e., v(n)=0).

In this section, we wish to compare, by way of simulation, the NLMS, PNLMS, and IPNLMS algorithms in the context of network echo cancellation. As shown in FIG. 2, we use three different echo paths h of length L=512. The same length is used for the adaptive filter ĥ(n). The sampling rate is 8 kHz and the signal-to-noise ratio is equal to 39 dB. The input signal x(n) is either a speech signal (FIG. 3) or a white Gaussian noise. The parameter settings chosen for all the simulations are:

$\mu = 0.2$, $\alpha = 0$, $\delta_p = 0.01$, $\rho = 0.01$, $$\delta_{NLMS} = \sigma_x^2, \quad \delta_{PNLMS} = \delta_{NLMS}/L, \quad \delta_{IPNLMS} = \frac{1-\alpha}{2L}\delta_{NLMS}$$

$\hat{h}(-1) = 0$

Figure 4A:
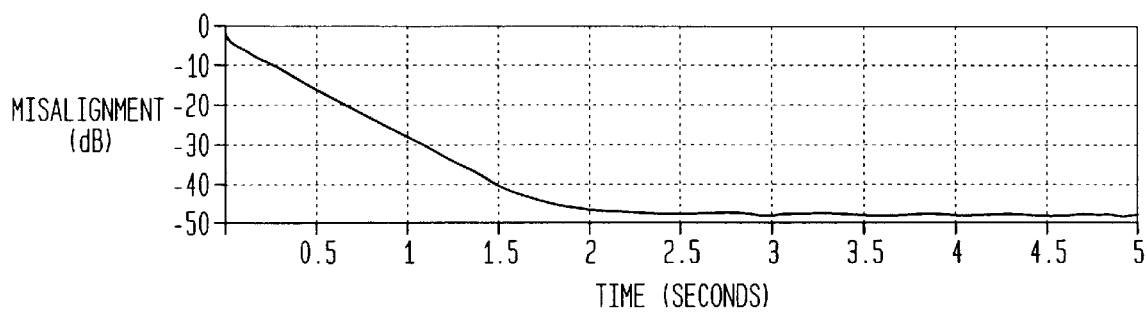
FIG. 4A is a graph illustrating performance in response to a white noise input and the sparse impulse response of FIG. 2A for a misalignment for an echo cancellation circuit using an NLMS algorithm of the prior art.
Figure 4B:
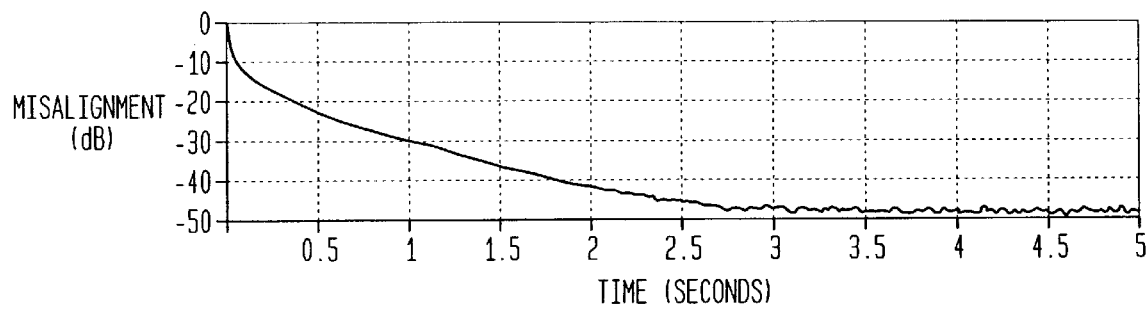
FIG. 4B is a graph illustrating performance in response to a white noise input and the sparse impulse response of FIG. 2A for a misalignment for an echo cancellation circuit using a PNLMS algorithm of the prior art.
Figure 4C:
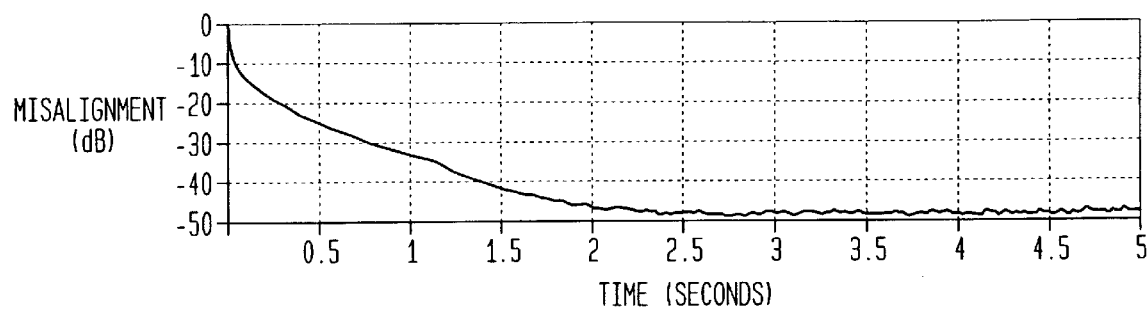
FIG. 4C is a graph illustrating performance in response to a white noise input and the sparse impulse response of FIG. 2A for a misalignment for an echo cancellation circuit using an embodiment of the improved PNLMS algorithm of the present invention.
Figure 5A:
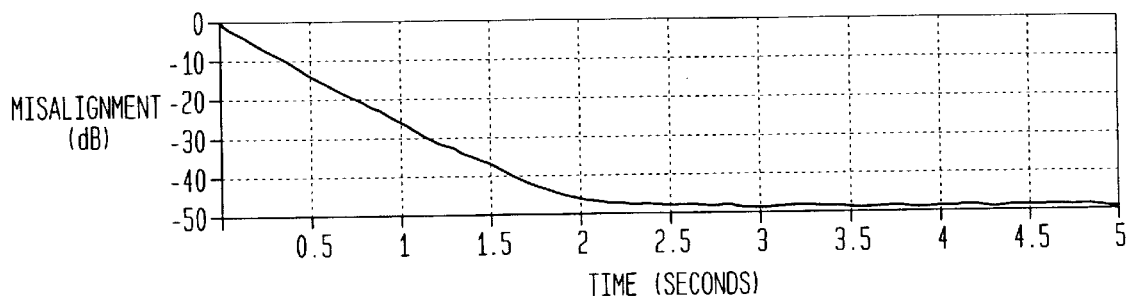
FIG. 5A is a graph illustrating performance in response to a white noise input and the dispersive impulse response of FIG. 2B for a misalignment for an echo cancellation circuit using an NLMS algorithm of the prior art.
Figure 5B:
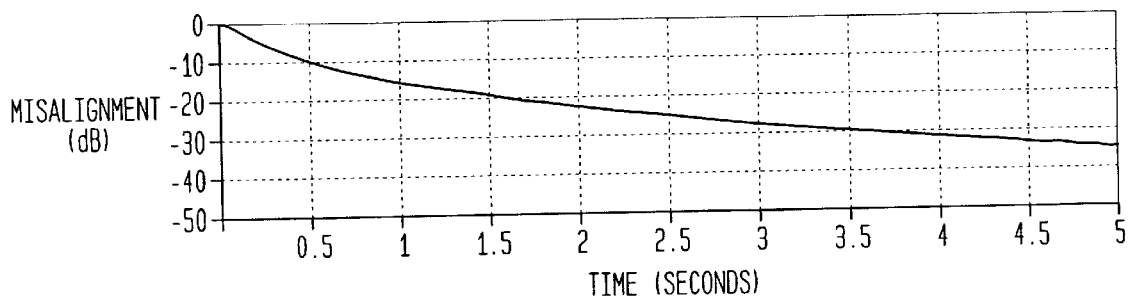
FIG. 5B is a graph illustrating performance in response to a white noise input and the dispersive impulse response of FIG. 2B for a misalignment for an echo cancellation circuit using a PNLMS algorithm of the prior art.
Figure 5C:
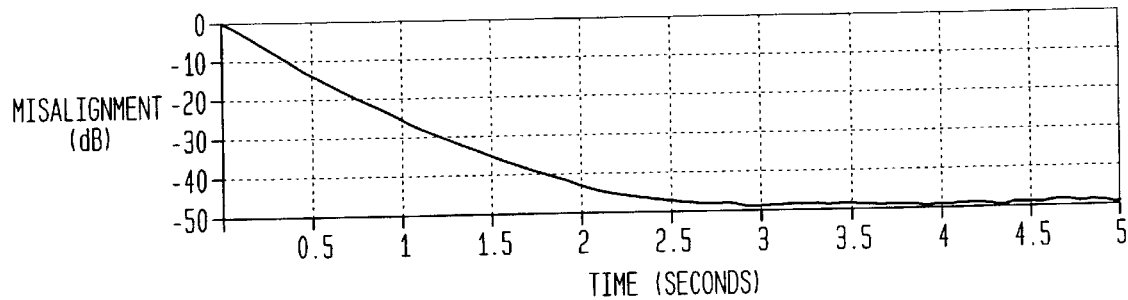
FIG. 5C is a graph illustrating performance in response to a white noise input and the dispersive impulse response of FIG. 2B for a misalignment for an echo cancellation circuit using an embodiment of the improved PNLMS algorithm of the present invention.
Figure 6A:
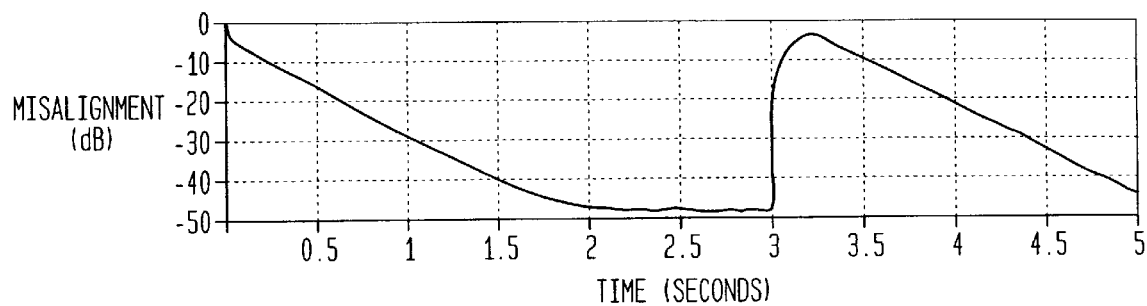
FIG. 6A is a graph illustrating performance in response to a white noise input and the sparse impulse response of FIG. 2A with an echo path change at 3 seconds for a misalignment for an echo cancellation circuit using an NLMS algorithm of the prior art.
Figure 6B:
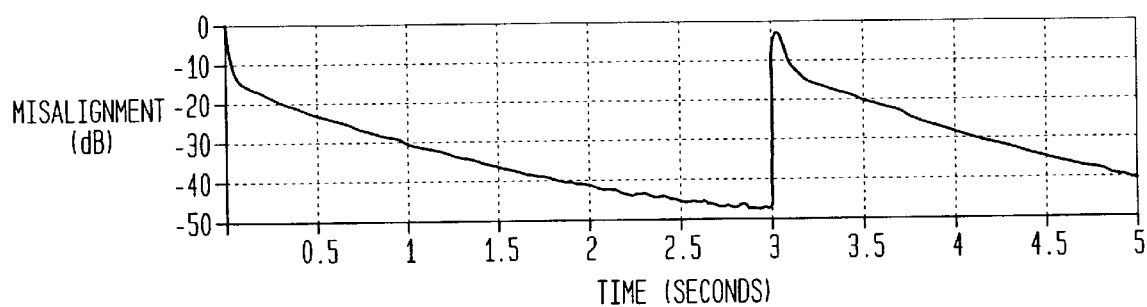
FIG. 6B is a graph illustrating performance in response to a white noise input and the sparse impulse response of FIG. 2A with an echo path change at 3 seconds for a misalignment for an echo cancellation circuit using a PNLMS algorithm of the prior art.
Figure 6C:
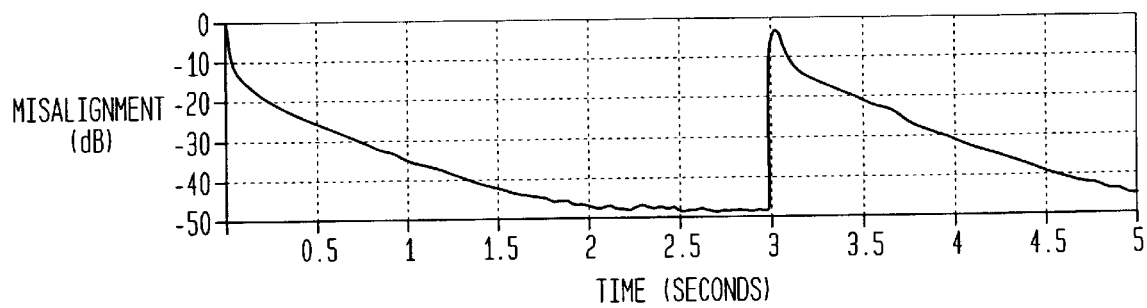
FIG. 6C is a graph illustrating performance in response to a white noise input and the sparse impulse response of FIG. 2A with an echo path change at 3 seconds for a misalignment for an echo cancellation circuit using an embodiment of the improved PNLMS algorithm of the present invention.

FIG. 4 compares the misalignment of the three algorithms: (a) NLMS, (b) PNLMS, and (c) IPNLMS, with a white noise as the far-end signal and the sparse impulse response of FIG. 2a. We can see that PNLMS and IPNLMS converge much faster than NLMS with a small advantage for IPNLMS. FIG. 5 shows the same thing but with the dispersive impulse response of FIG. 2b. While NLMS and IPNLMS have the same behavior, PNLMS deteriorates. FIG. 6 compares the algorithms in a tracking situation when, after 3 seconds, the impulse response is shifted on the right by 12 samples. The other conditions are the same as in FIG. 4. Both PNLMS and IPNLMS track better than NLMS.

Figure 3:
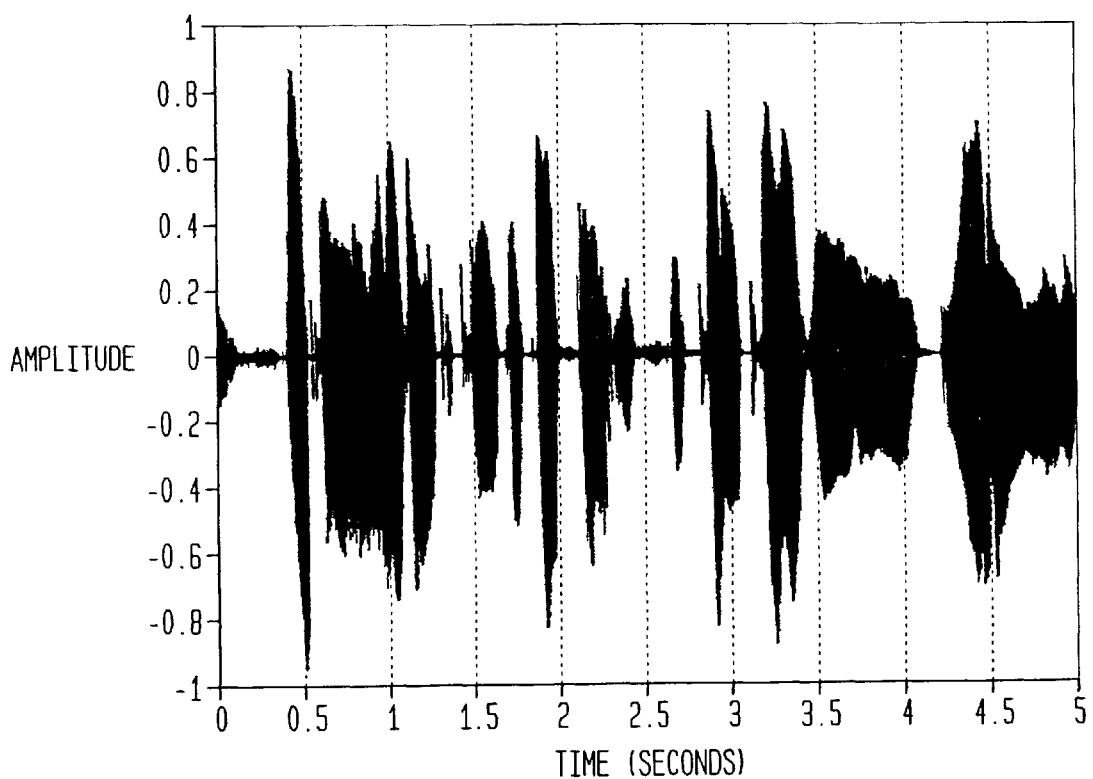
FIG. 3 is a graph illustrating an exemplary speech signal used in simulations of the present invention.
Figure 7A:
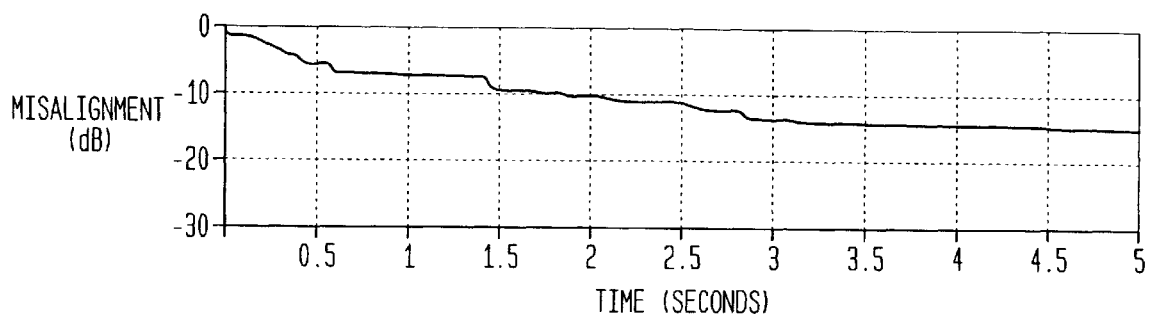
FIG. 7A is a graph illustrating performance in response to the speech signal of FIG. 3 and the sparse impulse response of FIG. 2A for a misalignment for an echo cancellation circuit using an NLMS algorithm of the prior art.
Figure 7B:
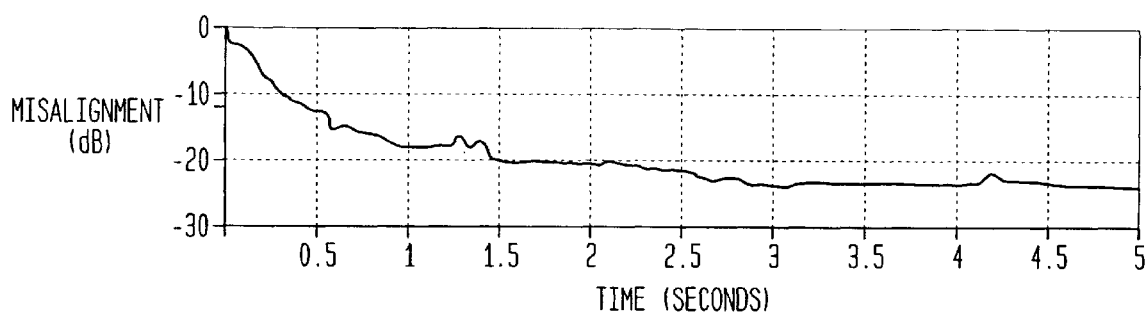
FIG. 7B is a graph illustrating performance in response to the speech signal of FIG. 3 and the sparse impulse response of FIG. 2A for a misalignment for an echo cancellation circuit using a PNLMS algorithm of the prior art.
Figure 7C:
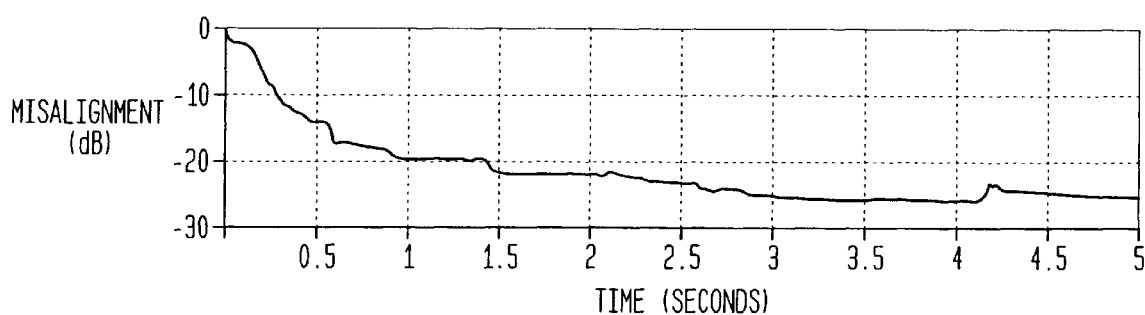
FIG. 7C is a graph illustrating performance in response to the speech signal of FIG. 3 and the sparse impulse response of FIG. 2A for a misalignment for an echo cancellation circuit using an embodiment of the improved PNLMS algorithm of the present invention.
Figure 8A:
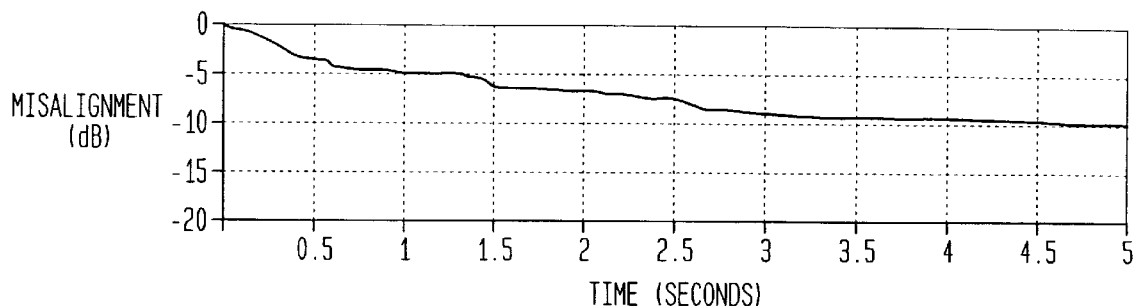
FIG. 8A is a graph illustrating performance in response to the speech signal of FIG. 3 and the dispersive impulse response of FIG. 2B for a misalignment for an echo cancellation circuit using an NLMS algorithm of the prior art.
Figure 8B:
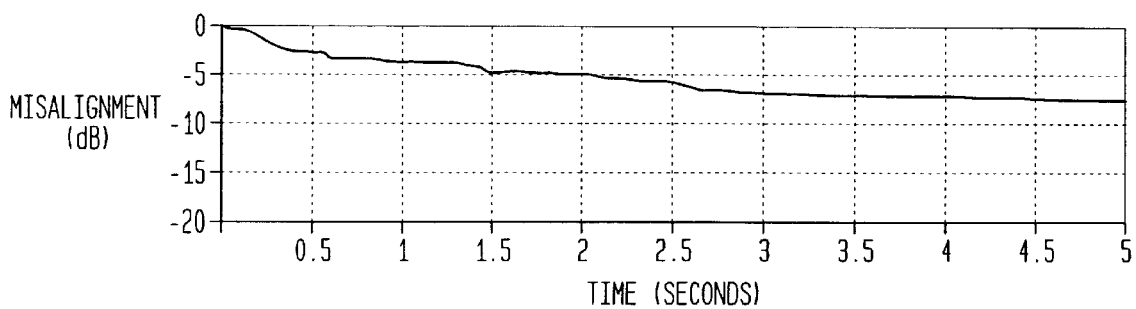
FIG. 8B is a graph illustrating performance in response to the speech signal of FIG. 3 and the dispersive impulse response of FIG. 2B for a misalignment for an echo cancellation circuit using a PNLMS algorithm of the prior art.
Figure 8C:
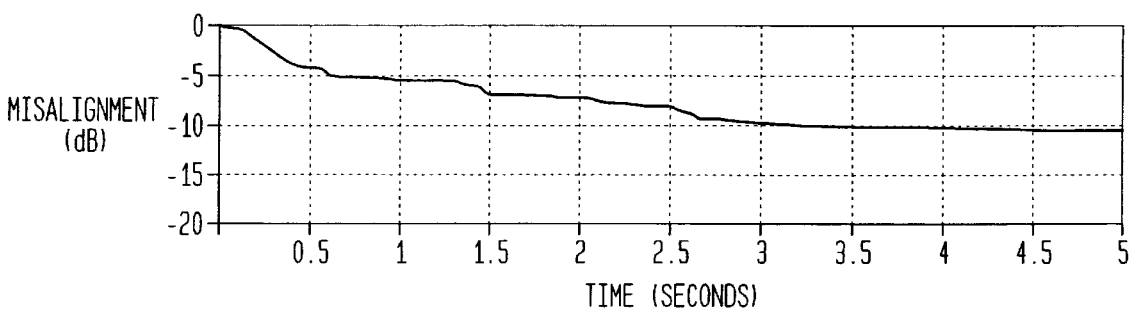
FIG. 8C is a graph illustrating performance in response to the speech signal of FIG. 3 and the dispersive impulse response of FIG. 2B for a misalignment for an echo cancellation circuit using an embodiment of the improved PNLMS algorithm of the present invention.

In FIGS. 7 and 8, the same simulations for FIGS. 4 and 5 are repeated but with the speech signal of FIG. 3 as the far-end signal. We can draw the same conclusions whether the input signal is white noise or speech.

Figure 2A:
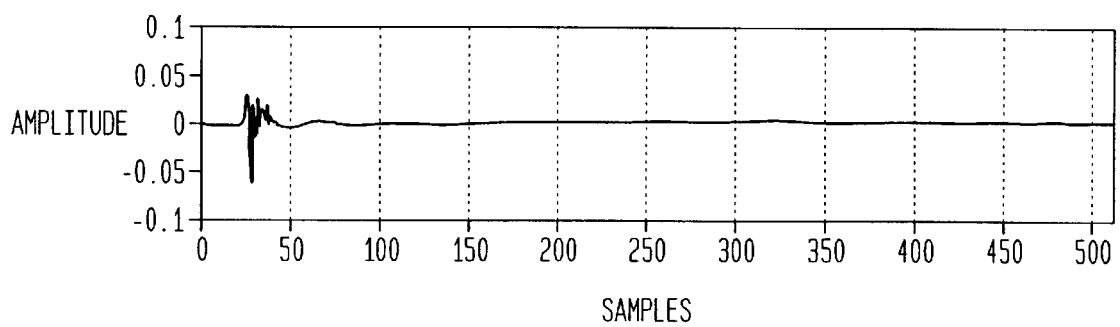
FIG. 2A is a graph illustrating the impulse response of a sparse echo path used in simulations of the present invention.
Figure 2B:
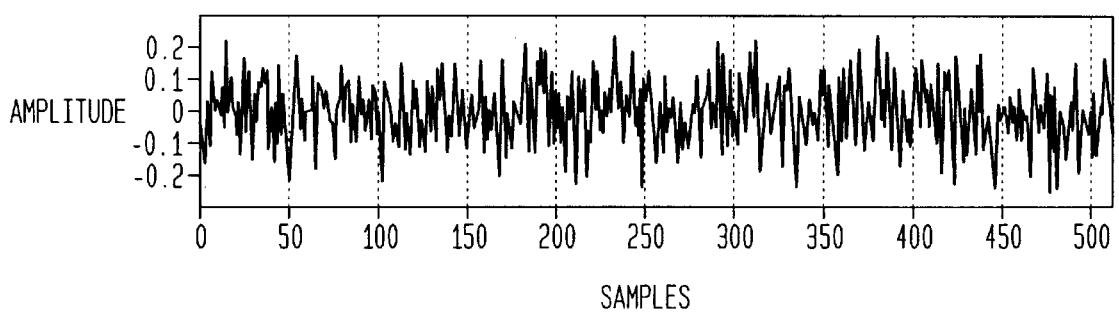
FIG. 2B is a graph illustrating the impulse response of a dispersive echo path used in simulations of the present invention.
Figure 9:
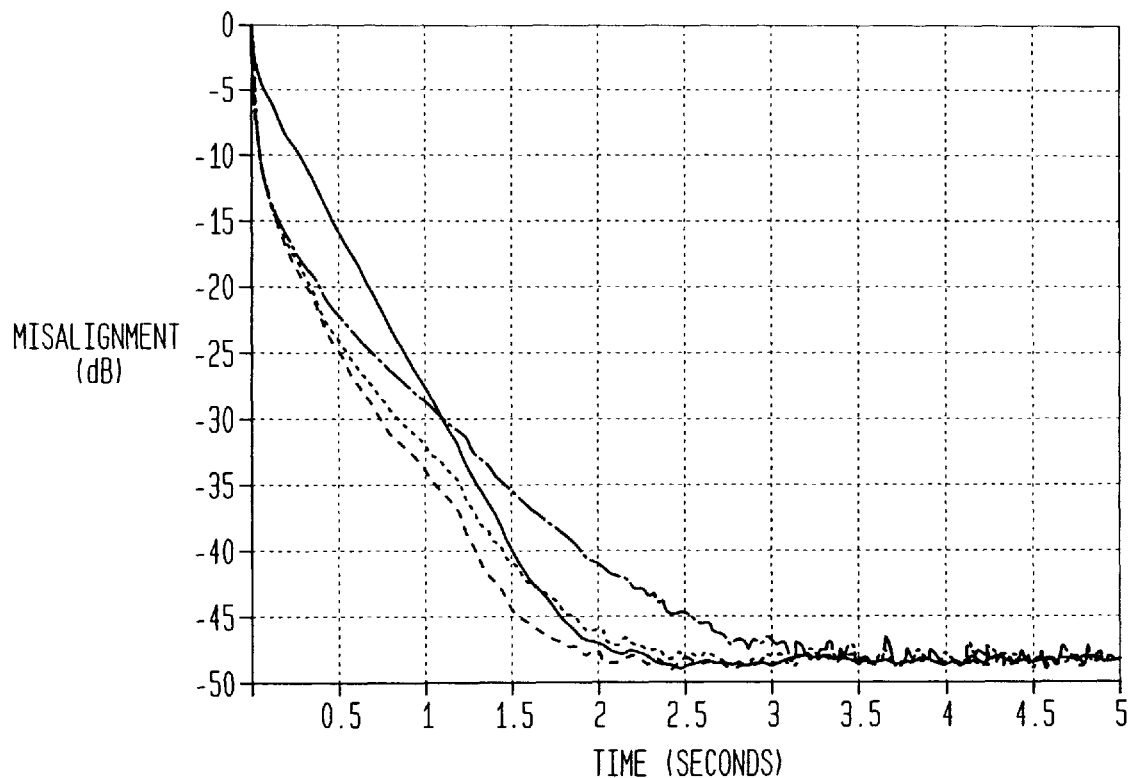
FIG. 9 is a graph illustrating performance in response to a white noise input and the sparse impulse response of FIG. 2A for a misalignment for an echo cancellation circuit using an embodiment of the improved PNLMS algorithm of the present invention using values of $\alpha$ of $-1$, $-0.5$, $0$, and $0.5$, respectively.
Figure 10:
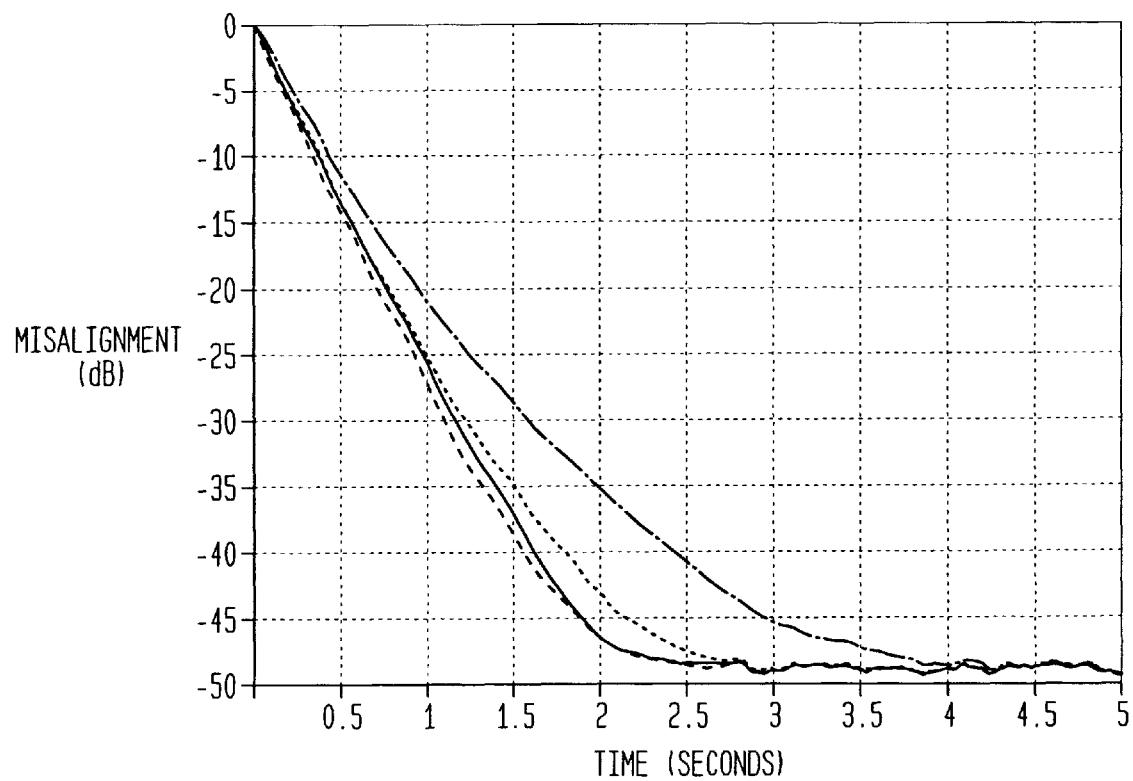
FIG. 10 is a graph illustrating performance in response to a white noise input and the dispersive impulse response of FIG. 2B for a misalignment for an echo cancellation circuit using an embodiment of the improved PNLMS algorithm of the present invention using values of $\alpha$ of $-1$, $-0.5$, $0$, and $0.5$, respectively.

FIG. 9 compares the misalignment of the IPNLMS algorithm with different values of the parameter $\alpha$ when the far-end signal is a white noise and the impulse response is sparse (FIG. 2a). Note that for α=−1, the IPNLMS and NLMS are the same. The IPNLMS algorithm performs very well with α=0 or α=−0.5. FIG. 10 compares the same algorithm with a dispersive impulse response (FIG. 2b). Even in this situation, the IPNLMS algorithm (for α=−0.5) performs a little better than NLMS.

Figure 2C:
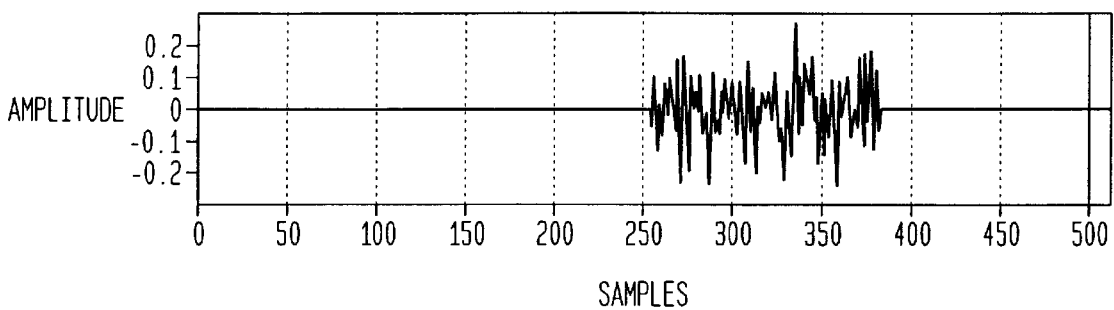
FIG. 2C is a graph illustrating the impulse response of a quasi-sparse echo path used in simulations of the present invention.
Figure 11:
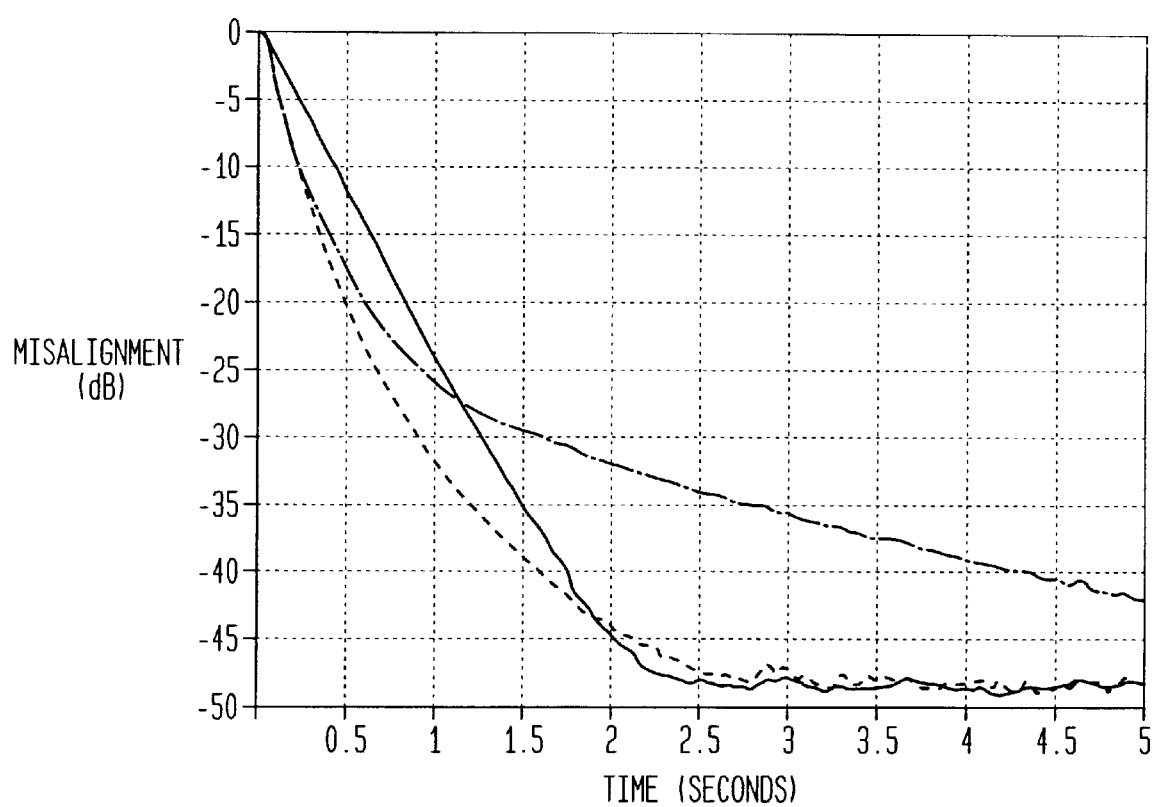
FIG. 11 is a graph illustrating performance in response to a white noise input and the quasi-sparse impulse response of FIG. 2c for a misalignment for an echo cancellation circuit using (1) an NLMS algorithm of the prior art, (2) a PNLMS algorithm of the prior art, and (3) an embodiment of the improved PNLMS algorithm of the present invention, respectively.

Finally, in the last simulation with white noise as input signal, we compare again the three algorithms (NLMS, PNLMS, and IPNLMS with α=0) with the quasi-sparse impulse response of FIG. 2c. FIG. 11 shows the result of this simulation. It is clear that the propose algorithm outperforms the two others for these simulations.

V. Conclusions

While the PNLMS algorithm behaves very nicely and has a very fast initial convergence rate compared to NLMS when the impulse response is very sparse, it has the annoying drawback of deteriorating quickly if the echo path is not sparse enough. It simply means that the rule used in PNLMS is not adequate and does not fully exploit the structure of the impulse response, though the algorithm works well in one particular case. In this specification, we derived a new and simple rule that overcomes this problem. In simulations, the proposed algorithm did no worse than NLMS. For very sparse impulse responses, the IPNLMS converges as well as PNLMS and, for an impulse response that is between sparse and dispersive, it behaves much better than both NLMS and PNLMS. For future work, it will be interesting to evaluate the IPNLMS in the acoustic echo cancellation context, since acoustic impulse responses are quite sparse in general (not as sparse as in the hybrid but not very dispersive either).

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

We claim:

1. A method of generating an estimate signal of an impulse response of a communications system to an original signal, said estimate signal comprising a plurality of discrete time values, each of said discrete time values comprising a plurality of coefficients, said method comprising the steps of:

(1) receiving said original signal; and (2) generating each of said discrete time values by updating each one of said coefficients corresponding to said discrete time value independently of the others of said coefficients corresponding to said discrete time value by adjusting an adaptation step size in proportion to said coefficient corresponding to a preceding discrete time using:

$$o_l(n) = (1-\alpha)\frac{\|\hat{h}(n)\|_1}{L} + (1+\alpha)|\hat{h}_l(n)|$$

$$l = 0, 1, \ldots, L-1$$

to take into account the structure of said impulse response, where:

$\hat{h}(n)$ is said estimate signal at time n;

n is said preceding discrete time;

L is the number of said coefficients; and $-1 \leq \alpha < 1$.

2. A method of generating an estimate signal that is an estimate of an impulse response of a communications system to an original signal, said method comprising the steps of:

(1) receiving said original signal; and (2) generating an estimate of an impulse response to said original signal by means of a proportionate normalized least mean squares algorithm using:

$$\hat{h}(n) = \hat{h}(n-1) + \frac{\mu}{x^T(n)O_1(n-1)x(n) + \delta_{IPNLMS}} O_1(n-1)x(n)e(n).$$

3. The method of claim 2 wherein:

$$O_1(n-1) = \text{diag}\{o_{1,0}(n-1), \ldots, o_{1,L-1}(n-1)\},$$

$$= \frac{1}{\|o(n-1)\|_1} \text{diag}\{o_0(n-1)\ldots, o_{L-1}(n-1)\}.$$

4. The method of claim 3 wherein;

$$o_l(n) = (1-\alpha)\frac{\|\hat{h}(n)\|_1}{L} + (1+\alpha)|\hat{h}_l(n)|$$

$$l = 0, 1, \ldots, L-1.$$

5. The method of claim 4 wherein:

$$o_{1,l}(n) = \frac{o_l(n)}{\|o(n)\|_1}$$

$$= \frac{1-\alpha}{2L} + (1+\alpha)\frac{|\hat{h}_l(n)|}{2\|\hat{h}(n)\|_1},$$

$$l = 0, 1, \ldots, L-1.$$

6. The method of claim 4 wherein:

$$o_{1,l}(n) = \frac{o_l(n)}{\|o(n)\|_1}$$

$$= \frac{1-\alpha}{2L} + (1+\alpha)\frac{|\hat{h}_l(n)|}{2\|\hat{h}(n)\|_1 + \varepsilon},$$

$$l = 0, 1, \ldots, L-1.$$

7. A method of generating an estimate signal $\hat{h}(n)$, where n denotes one of a plurality of consecutive discrete times, of an echo of an original signal x(n) received at a transceiver via a communications system, said original signal x(n) being coupled into a signal y(n) that is transmitted from said transceiver via said communications system, said estimate signal $\hat{h}(n)$ comprising a plurality of coefficients $h_0$, $h_1$, $h_2$, ... $h_1$, ... $h_{L-1}$, said method comprising the steps of:

(1) receiving said original signal x(n); and (2) generating said estimate signal $\hat{h}(n)$ by updating each one of said coefficients $h_1(n)$ independently of the others of said coefficients by adjusting an adaptation step size $\mu$ in proportion to said coefficient for time n−1, $h_1(n-1)$ using:

$$o_l(n) = (1-\alpha)\frac{\|\hat{h}(n)\|_1}{L} + (1+\alpha)|\hat{h}_l(n)|$$

$$l = 0, 1, \ldots, L-1$$

to take into account the structure of said impulse response, where $-1 \leq \alpha < 1$.

8. A method of generating a signal that is an estimate of an echo of an original signal received at a transceiver via a communications system, said original signal being coupled into a signal that is transmitted from said transceiver via said communications system, said method comprising the steps of:

(1) receiving said original signal; and
(2) generating an estimate of an impulse response to said original signal by means of a proportionate normalized least mean squares algorithm using:

$$\hat{h}(n) = \hat{h}(n-1) + \frac{\mu}{x^T(n)O_1(n-1)x(n) + \delta_{IPNLMS}} O_1(n-1)x(n)e(n).$$

9. The method of claim 8 wherein:

$$O_1(n-1) = \text{diag}\{o_{1,0}(n-1), \ldots, o_{1,L-1}(n-1)\},$$

$$= \frac{1}{\|o(n-1)\|_1}\text{diag}\{o_0(n-1)\ldots, o_{L-1}(n-1)\}.$$

10. The method of claim 9 wherein;

$$o_l(n) = (1-\alpha)\frac{\|\hat{h}(n)\|_1}{L} + (1+\alpha)|\hat{h}_l(n)|$$

$$l = 0, 1, \ldots, L-1.$$

11. The method of claim 10 wherein:

$$o_{1,l}(n) = \frac{o_l(n)}{\|o(n)\|_1}$$

$$= \frac{1-\alpha}{2L} + (1+\alpha)\frac{|\hat{h}_l(n)|}{2\|\hat{h}(n)\|_1},$$

$$l = 0, 1, \ldots, L-1.$$

12. The method of claim 10 wherein:

$$o_{1,l}(n) = \frac{o_l(n)}{\|o(n)\|_1}$$

$$= \frac{1-\alpha}{2L} + (1+\alpha)\frac{|\hat{h}_l(n)|}{2\|\hat{h}(n)\|_1 + \varepsilon},$$

$$l = 0, 1, \ldots, L-1.$$

13. A method of performing echo cancellation in a communications system, said method comprising the steps of:

(1) receiving a signal that is a potential source of echo;
(2) generating an estimate signal of an impulse response corresponding to echo of said original signal, said estimate signal comprising a plurality of discrete time values, each of said discrete time values comprising a plurality of coefficients, by means of a proportionate normalized least mean squares algorithm by generating each of said discrete time values by updating each one of said coefficients corresponding to said discrete time value independently of the others of said coefficients corresponding to said discrete time value by adjusting an adaptation step size in proportion to said coefficient corresponding to a preceding discrete time using:

$$o_l(n) = (1-\alpha)\frac{\|\hat{h}(n)\|_1}{L} + (1+\alpha)|\hat{h}_l(n)|$$

$$l = 0, 1, \ldots, L-1$$

to take into account the structure of said impulse response, where:

$\hat{h}(n)$ is said estimate signal at time n;
n is said preceding discrete time;
L is the number of said coefficients; and
$-1 \leq \alpha < 1$; and (3) subtracting said estimate signal from a transmitted signal in order to cancel said echo from said transmitted signal.

14. The method of claim 13 wherein step (2) comprises using:

$$\hat{h}(n) = \hat{h}(n-1) + \frac{\mu}{x^T(n)O_1(n-1)x(n) + \delta_{IPNLMS}} O_1(n-1)x(n)e(n)$$

where
e(n) is an error signal;
x(n) is said original signal: and
$^T$ designates a transpose function.

15. The method of claim 14 wherein:

$$O_1(n-1) = diag\{o_{1,0}(n-1), \ldots, o_{1,L-1}(n-1)\}$$

$$= \frac{1}{\|o(n-1)\|_1}diag\{o_0(n-1)\ldots, o_{L-1}(n-1)\}.$$

16. The method of claim 15 wherein:

$$o_{1,l}(n) = \frac{o_l(n)}{\|o(n)\|_1}$$

$$= \frac{1-\alpha}{2L} + (1+\alpha)\frac{|\hat{h}_l(n)|}{2\|\hat{h}(n)\|_1},$$

$$l = 0, 1, \ldots, L-1.$$

17. The method of claim 15 wherein:

$$o_{1,l}(n) = \frac{o_l(n)}{\|o(n)\|_1}$$

$$= \frac{1-\alpha}{2L} + (1+\alpha)\frac{|\hat{h}_l(n)|}{2\|\hat{h}(n)\|_1 + \varepsilon},$$

$$l = 0, 1, \ldots, L-1.$$

18. An apparatus for performing echo cancellation in a transceiver, said apparatus comprising:

(1) a transmit electrical path upon which transmit signals are imposed by said transceiver;

(2) a receive electrical path upon which are received signals that are a potential source of echo that may be coupled onto said transmit path are received at said transceiver;

(3) a circuit for generating an estimate signal of an impulse response corresponding to echo of said original signal that may be coupled onto said transmit path, said estimate signal comprising a plurality of discrete time values, each of said discrete time values comprising a plurality of coefficients, said signal being generated by means of a proportionate normalized least mean squares algorithm in which each of said discrete time values is generated by updating each one of said coefficients corresponding to said discrete time value independently of the others of said coefficients corresponding to said discrete time value by adjusting an adaptation step size in proportion to said coefficient for a preceding time value using:

$$o_l(n) = (1-\alpha)\frac{\|\hat{h}(n)\|_1}{L} + (1+\alpha)|\hat{h}_l(n)|$$

$$l = 0, 1, \ldots, L-1$$

to take into account the structure of said impulse response, where:

$\hat{h}(n)$ is said estimate signal at time n;

n is said preceding discrete time;

L is the number of said coefficients; and $-1 \leq \alpha < 1$; and (4) a subtracter coupled to receive said estimate signal at a first input thereto and coupled to receive said transmitted signal at a second input thereto and generate at an output thereof a signal that is the difference between said first and second inputs in order to cancel said echo from said transmitted signal.

19. An apparatus for performing echo cancellation in a transceiver, said apparatus comprising:

(1) a transmit electrical path upon which transmit signals are imposed by said transceiver;

(2) a receive electrical path upon which are received signals that are a potential source of echo that may be coupled onto said transmit path are received at said transceiver;

(3) a circuit for generating a signal that is an estimate of an impulse response corresponding to echo of said received signals that may be coupled onto said transmit path, said circuit generating said estimate signal by means of a proportionate normalized least mean squares algorithm using:

$$\hat{h}(n) = \hat{h}(n-1) + \frac{\mu}{x^T(n)O_1(n-1)x(n) + \delta_{IPNLMS}} O_1(n-1)x(n)e(n); \text{ and}$$

(4) a subtracter coupled to receive said estimate signal at a first input thereto and coupled to receive said transmitted signal at a second input thereto and generate at an output thereof a signal that is the difference between said first and second inputs in order to cancel said echo from said transmitted signal.

20. The method of claim 19 wherein:

$$O_1(n-1) = diag\{o_{1,0}(n-1), \ldots, o_{1,L-1}(n-1)\}$$

$$= \frac{1}{\|o(n-1)\|_1} diag\{o_0(n-1)\ldots, o_{L-1}(n-1)\} \ .$$

21. The method of claim 20 wherein;

$$o_l(n) = (1-\alpha)\frac{\|\hat{h}(n)\|_1}{L} + (1+\alpha)|\hat{h}_l(n)|$$

$$l = 0, 1, \ldots, L-1.$$

22. The method of claim 21 wherein:

$$o_{1,l}(n) = \frac{o_l(n)}{\|o(n)\|_1} = \frac{1-\alpha}{2L} + (1+\alpha)\frac{|\hat{h}_l(n)|}{2\|\hat{h}(n)\|_1}, l = 0, 1, \ldots, L-1.$$

23. The method of claim 21 wherein:

$$o_{1,l}(n) = \frac{o_l(n)}{\|o(n)\|_1} = \frac{1-\alpha}{2L} + (1+\alpha)\frac{|\hat{h}_l(n)|}{2\|\hat{h}(n)\|_1 + \varepsilon}, l = 0, 1, \ldots, L-1.$$

* * * * *